(12) United States Patent
Tran

(10) Patent No.: US 6,826,079 B2
(45) Date of Patent: Nov. 30, 2004

(54) METHOD AND SYSTEM FOR PERFORMING EQUIPOTENTIAL SENSING ACROSS A MEMORY ARRAY TO ELIMINATE LEAKAGE CURRENTS

(75) Inventor: Lung T. Tran, Saratoga, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/459,437

(22) Filed: Jun. 10, 2003

(65) Prior Publication Data

US 2003/0206473 A1 Nov. 6, 2003

Related U.S. Application Data

(62) Division of application No. 10/084,111, filed on Feb. 25, 2002, now Pat. No. 6,678,189.

(51) Int. Cl.[7] ................................................. G11C 7/00
(52) U.S. Cl. ........................ 365/171; 365/203; 365/210
(58) Field of Search ................................. 365/171, 203, 365/207, 208, 210

(56) References Cited

U.S. PATENT DOCUMENTS 5,347,485 A * 9/1994 Taguchi et al. ............. 365/171
5,911,193 A * 6/1999 Johnson ...................... 119/28.5
6,011,739 A * 1/2000 Baek ........................... 365/210
6,130,538 A * 10/2000 Carrozzi et al. ............ 324/319

* cited by examiner

Primary Examiner—Vu A. Le

(57) ABSTRACT

A method and system for minimizing a leaked current within an array of memory cells as well as a method and system for differentiating a resistive value within a sensed memory cell during a read operation are disclosed. The memory array includes a plurality of bit lines and word lines that are cross-coupled via a plurality of memory cells. Each memory cell is limited in providing a conductive path in a first direction only by way of a unidirectional element. Such unidirectional elements typically comprise of diodes. The apparatus utilizes the diodes to form a current path from the bit line to the word line having passed through the diode and resistive memory cell. Further, a differential sense amplifier is utilized to differentiate the sensed current during a read operation from a reference value after an equipotential value is placed across the array to limit leakage current from developing within adjoining word and bit lines during a sense operation of a given memory cell.

5 Claims, 5 Drawing Sheets

METHOD AND SYSTEM FOR PERFORMING EQUIPOTENTIAL SENSING ACROSS A MEMORY ARRAY TO ELIMINATE LEAKAGE CURRENTS

This Application is a Div. of Ser. No. 10/084,111 Feb. 25, 2002 Now U.S. Pat. No. 6,678,189.

BACKGROUND OF THE INVENTION

The present invention relates generally to random access memory for data storage. More specifically, the present invention relates to a magnetic random access memory device that includes an array of memory cells and differential sense amplifiers working in conjunction with unidirectional elements to limit leakage current within the array.

Magnetic random access memory ("MRAM") is a non-volatile memory that shows considerable promise for long-term data storage. Performing read and write operations on MRAM devices are much faster than performing read and write operations on conventional memory devices such as DRAM and Flash and order of magnitude faster than long-term storage devices such as hard drives. In addition, the MRAM devices are more compact and consume less power than other conventional storage devices.

A typical MRAM device includes an array of memory cells. Word lines extend across rows of the memory cells and bit lines extend along columns of the memory cells. Each memory cell is located at a crosspoint of the word line and a bit line.

A memory cell stores a bit of information as an orientation of a magnetization. The magnetization of each memory cells assumes one of two stable orientations at any given time. These two stable orientations, parallel and anti-parallel, represent logic values of "0" and "1".

The magnetization orientation affects the resistance of a memory cell such as a spin-tunneling device. For instance, resistance of a memory cell is a first value R if the magnetization orientation is parallel and resistance of the memory cell is increased to a second value $R+\Delta R$ if the magnetization orientation is changed from parallel to anti-parallel. The magnetization orientation of a selected memory cell and, therefore, the logic state of the memory cell may be read by sensing the resistance state of the memory cell. The memory cells thus form a memory array of resistive crosspoints.

Applying a voltage to a selected memory cell and measuring a sense current that flows through the memory cell may sense the resistance state. The resistance would be determined by the ratio of applied voltage and the sense current ($R=V/I$).

Sensing the resistance state of a single memory cell in an array, however, can be unreliable. All memory cells in the array are coupled together through many parallel paths. The resistance seen at one crosspoint equals the resistance of the memory cell at that crosspoint in parallel with resistances of memory cells in the other rows and columns of the array.

Moreover, if the memory cell being sensed has a different resistance due to the stored magnetization, a small differential voltage may develop. This small differential voltage can give rise to a parasitic or "sneak path" current, which is also known as a leakage current. The parasitic or leakage current becomes large in a large array and, therefore, can obscure the sense current. Consequently, the parasitic current can prevent the resistance from being sensed.

Unreliability in sensing the resistance state is compounded by manufacturing variations, variations in operating temperatures of the MRAM devices. These factors can cause the average value of resistance in the memory cell to vary.

The prior art has attempted to reduce, if not actually eliminate leakage current through various designs. One approach involves adding a unidirectional element, such as a diode, to limit the current path in one direction. FIG. 1 illustrates such an embodiment. The memory cell 4 includes a diode 6 to limit current flow in the direction dictated by the diode 6. When a sense current is applied as shown in FIG. 1, the current actually measured by the sense amplifier is the sense current I_s flowing through the intended cell 4, and the leakage current I_leak, which flows through several other memory cell/diode pairs. This additional leakage current reduces the operating range of the sense amplifier. Further, as the size of the memory array increases, the leakage current dominates the sense signal, reducing even more the operating range of the sense amplifier. Additionally, noise increases in the sensing amplifier because of the leakage current paths.

Accordingly, there is a need to be able to sense the resistance states of the memory cells within the MRAM devices in a reliable fashion. Further, there is a need to limit the parasitic or leakage current that exists between cells not being sensed within the array during a read operation.

SUMMARY OF THE INVENTION

According to the present invention, a method and system for minimizing a leaked current within an array of memory cells as well as a method and system for differentiating a resistive value within a sensed memory cell during a read operation are disclosed. The memory array includes a plurality of bit lines and word lines that are cross-coupled via a plurality of memory cells. Each memory cell is limited in providing a conductive path in a first direction only by way of a unidirectional element. Such unidirectional elements typically comprise of diodes. The apparatus utilizes the diodes to form a current path from the word line to the bit line having passed through the diode and resistive memory cell. Further, a differential sense amplifier is utilized to differentiate the sensed current during a read operation from a reference value after an equipotential value is placed across the array to limit leakage current from developing within adjoining word and bit lines during a sense operation of a given memory cell.

DETAILED DESCRIPTION

Figure 1:
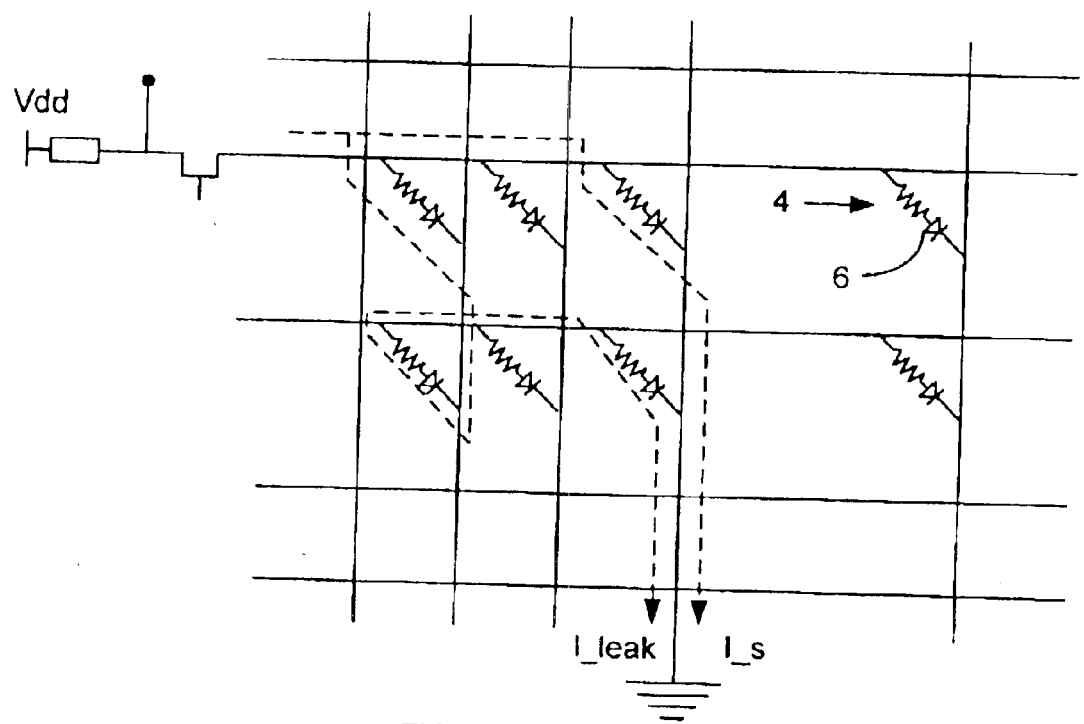
FIG. 1 depicts a prior art schematic diagram of a sense operation on a selected memory cell and how leakage current affects the sense current.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

As shown in the drawings for purposes of illustration, the present invention is embodied in a magnetic random access memory device. The MRAM device includes an array of memory cells and a read circuit for reading data from the memory cells. The read circuit, which includes equipotential application devices and differential sensing amplifiers, can reliably sense different resistance states of selected memory cells within the array.

Figure 2:
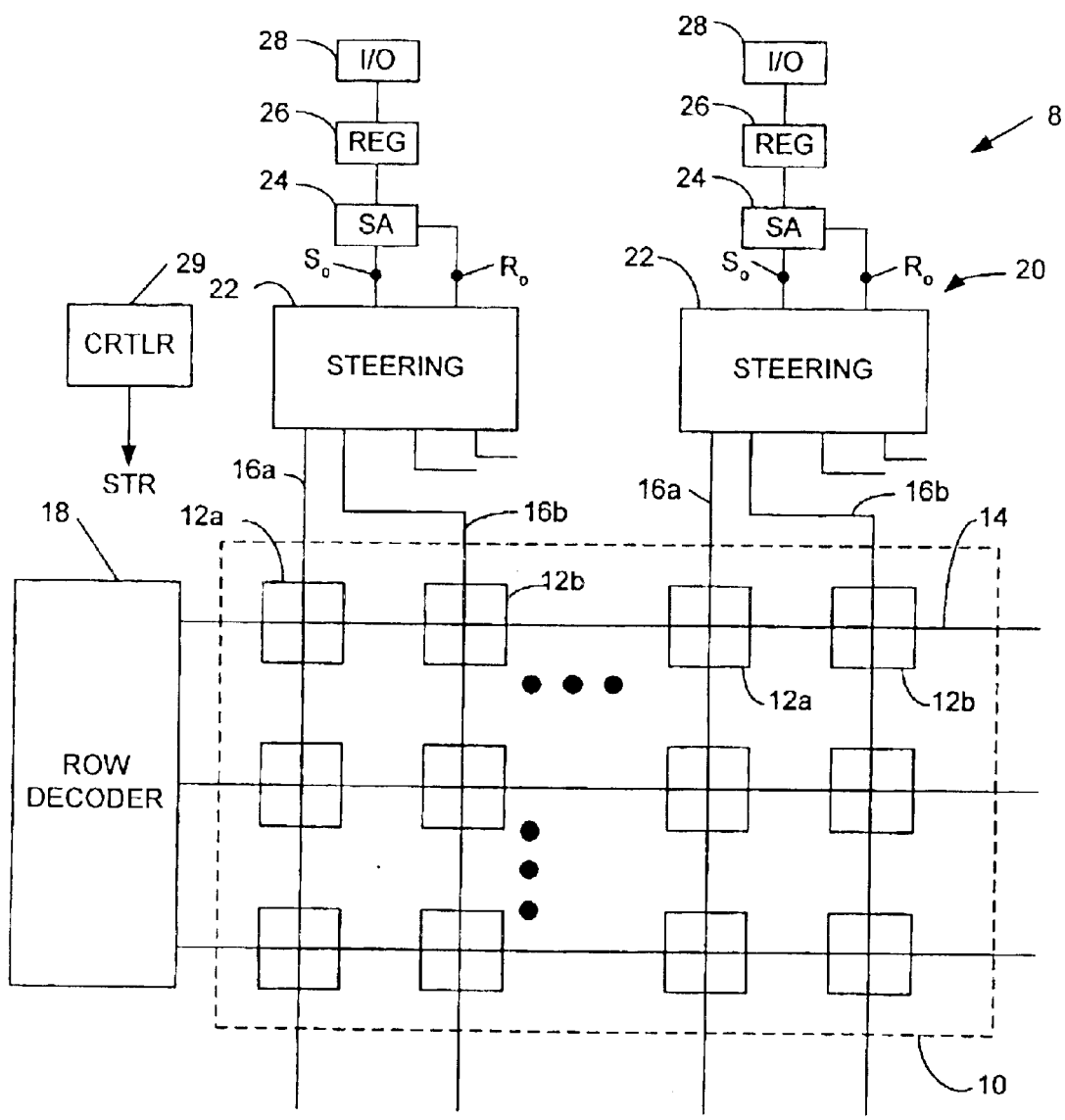
FIG. 2 illustrates an MRAM device that includes an array of memory cells and a read circuit in accordance with the present invention.

Reference is now made to FIG. 2, which illustrates an information storage device 8 including a resistive crosspoint array 10 of memory cell elements 12a and 12b. The memory cell elements 12a and 12b are arranged in rows and columns, with the rows extending along an x-direction and the columns extending along a y-direction. Only a relatively small number of memory cell elements 12a and 12b is shown to simplify the illustration of the information storage device 8. In practice, arrays of any size may be used.

Traces functioning as word lines 14 extend along the x-direction in a plane on one side of the memory cell array 10. Traces functioning as bit lines 16a and 16b extend along the y-direction in a plane on an adjacent side of the memory cell array 10. There may be one word line 14 for each row of the array 10 and one bit line 16a or 16b for each column of the array 10. Each memory cell element 12a, 12b is located at a crosspoint of a word line 14 and a bit line 16a or 16b.

Figure 3:
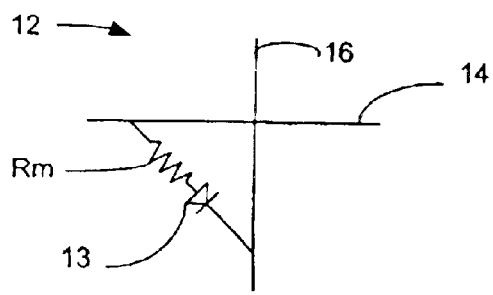
FIG. 3 illustrates a schematic diagram of the memory cell in accordance with FIG. 1.

The memory cell elements 12a and 12b may include thin film memory elements such as polymer memory elements, magnetic tunnel junctions (the SDT junction is a type of magnetic tunnel junction), or phase change devices. In general, the memory cells 12a and 12b may include any elements that store or generate information by affecting the magnitude of the nominal resistance of the elements. Such other types of elements include poly-silicon resistors as part of read-only memory, and phase change device that could be programmed to change state from crystalline to amorphous and vice versa. The device has low resistance at crystalline state and high resistance at amorphous state. Each memory cell element 12 is shown in further detail in FIG. 3. Memory cell 12 further includes a resistive magnetic element Rm and a unidirectional conducting gate or diode 13, which are utilized to limit leakage current during the read operation as well as to provide a one-way current path from the bit lines 16a, b to a word line 14. The diode 13 is coupled to the resistive magnetic element Rm to provide a unidirectional conductive path from the bit line 16 to the word line 14.

The diode is fabricated using techniques well know to those skilled in the art. For example, an n-type poly-silicon layer and a p-type poly-silicon layer are sequentially deposited on the word-line conductor and then annealed at 700°–800° C. to recrystallize and activate the poly-silicon layers to make a p-n diode. It is possible to form a Schottky diode with a Schottky metal layer and a semiconductor layer. An amorphous diode may also be utilized alternatively as an isolation element.

Resistance of the SDT junction, for example, is a first value (R) if its magnetization orientation is parallel, and its resistance is increased to a second value (R+ΔR) if its magnetization orientation is changed from parallel to anti-parallel. A typical first resistance value (R) may be about 10 kΩ-1 MΩ and a typical change in resistance (ΔR) may about 30% of the first resistance value (R).

Each memory cell element 12a and 12b retains its orientation of magnetization, even in the absence of external power. Therefore, the memory cell elements 12a and 12b are non-volatile.

Data is stored in the memory cell elements 12a and 12b in a bit-bitbar manner. Two memory cell elements 12a and 12b are assigned to each bit of data: one memory cell element (the "data" element) 12a stores the value of the bit, and the other memory cell element (the "reference" element) 12b stores the complement of the value. Thus, if a data element 12a stores a logic '1', its corresponding reference element 12b stores a logic '0'. Each column of data elements 12a is connected to a bit line 16a and each column of reference elements 12b is connected to a bit line 16b.

The information storage device 8 includes a row decoder 18 for selecting word lines 14 during read and write operations. A selected word line 14 may be connected to ground during a read operation. A write current may be applied to a selected word line 14 during a write operation.

The information storage device 8 includes a read circuit for sensing the resistance states of selected memory cell elements 12a and 12b during read operations and a write circuit for supplying write currents to selected word and bit lines 14, 16a and 16b during write operations. The read circuit is indicated generally at 20. The write circuit is not shown in order to simplify the illustration of the information storage device 8.

The read circuit 20 includes a plurality of steering circuits 22 and sense amplifiers 24. Multiple bit lines 16a and 16b are connected to each steering circuit 22. Each steering circuit 22 includes a decoder for selecting bit lines. A selected memory cell element 12 lies at the intersection of a selected word line 14 and a selected bit line 16.

Figure 6:
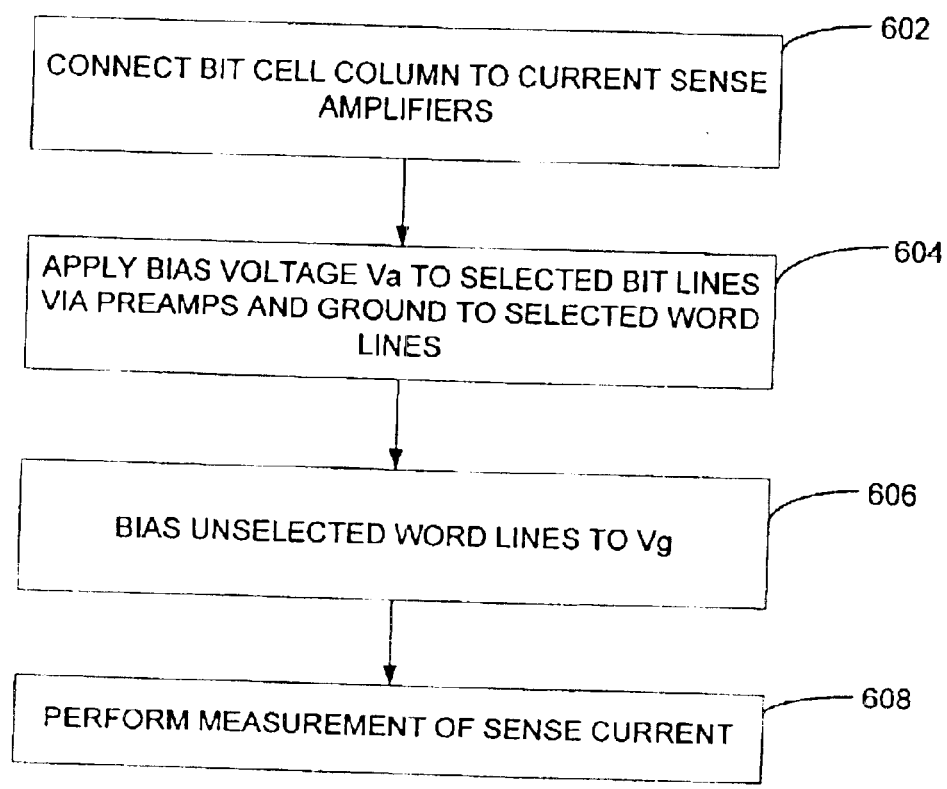
FIG. 6 depicts a flow diagram of the biasing scheme used during a sense operation in accordance with the present invention.

During a read operation, which is also depicted in the flow diagram of FIG. 6, the selected elements 12a and 12b are connected to ground by the selected word line 14, as shown in block 604. Each steering circuit 22 selects a bit line 16a crossing a column of data elements 12a and a bit line 16b crossing the corresponding column of reference elements 12b. The selected bit lines 16a crossing the columns of data elements 12a are connected to sense nodes S0 of their corresponding sense amplifiers 24, as shown in block 602. The steps of block 602 and 604 can be reversed and their order of implementation is not significant. The selected bit lines 16b crossing the columns of reference elements 12b are connected to reference nodes R0 of their corresponding sense amplifiers 24. Each sense amplifier 24 includes a differential amplifier and cross-couple latched current sense amplifiers for comparing signals on the bit lines 16a and 16b. The comparison indicates the resistance state of the selected data element 12a and, therefore, the logic value stored in the selected data element 12a. An output of the sense amplifier 24 is supplied to a data register 26, which, in turn, is coupled to an I/O pad 28 of the information storage device 8.

All unselected word lines 14, are connected to a constant voltage source, which provides an array voltage as shown in block 606. An external circuit may provide the constant voltage source. The sense amplifiers 24 apply the same potential to the selected bit lines 16 as the constant voltage source applies to the subset of unselected word-lines. Applying such equipotential isolation to the array 10 reduces parasitic currents.

The read circuit 20 may read out data in m-bit words, whereby the resistance states of a number (m) of memory cell elements 12a and 12b are sensed simultaneously, which is shown as the current measurement step of block 608. An m-bit word might be read out by operating m consecutive sense amplifiers 24 simultaneously. FIGS. 7 (7a, 7b, and 7c) illustrates how the leakage current I_leak is directed away from the sense current $I_S$, as opposed to the parasitic leakage current problem illustrated in FIG. 1 as previously mentioned.

Figure 7A:
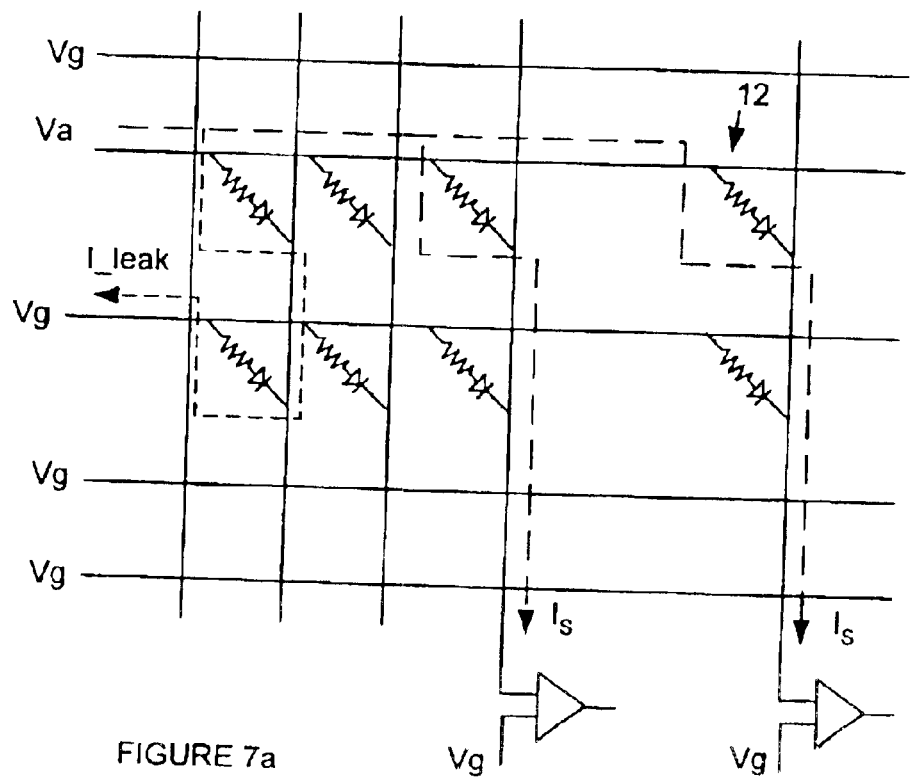
FIGS. 7a, 7b, 7c. 7 illustrates the improved sense current performance based on the biasing scheme of FIG. 6.
Figure 4:
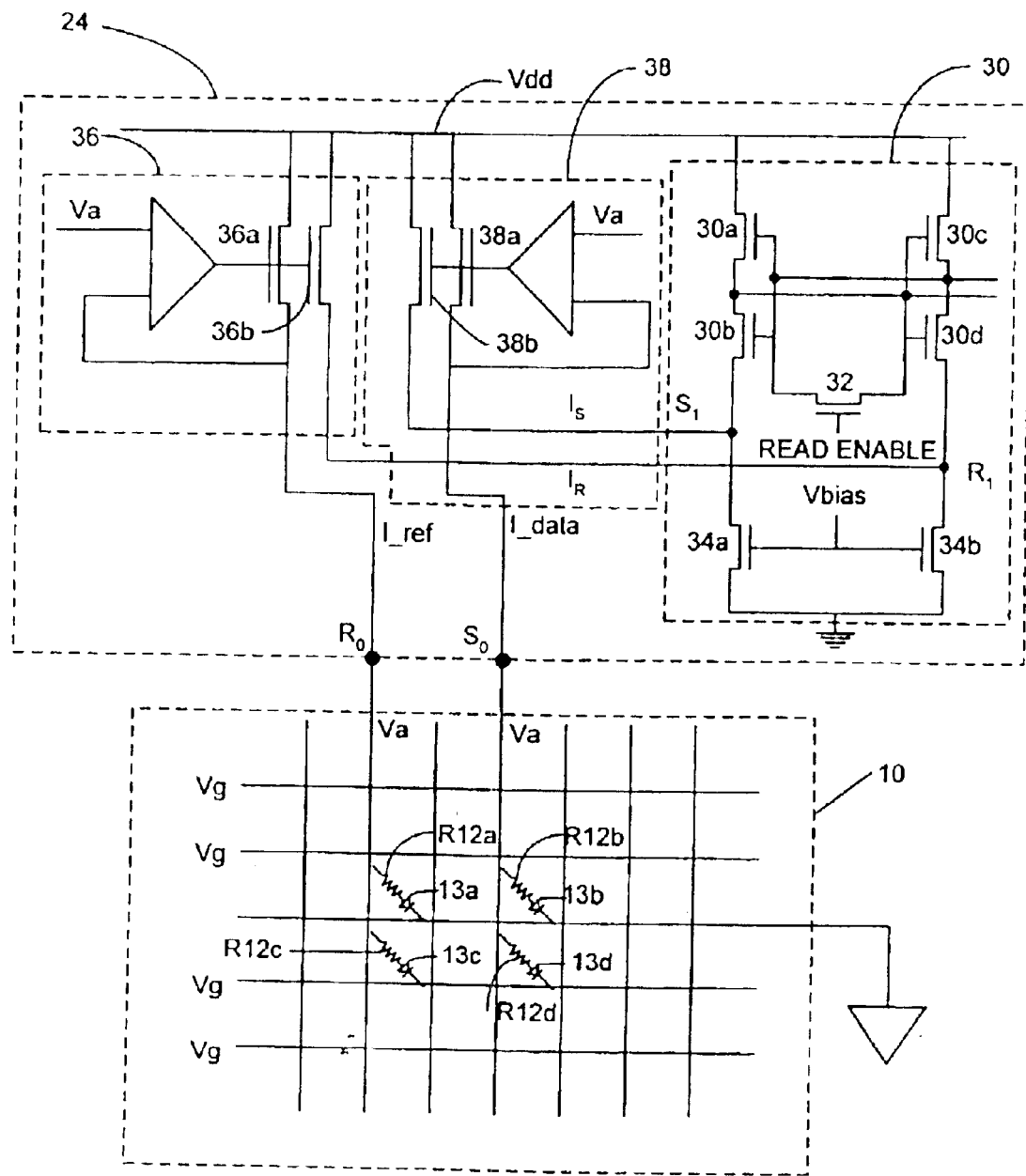
FIG. 4 illustrates a schematic diagram of the sensing amplifier elements in accordance with FIG. 1.
Figure 7B:
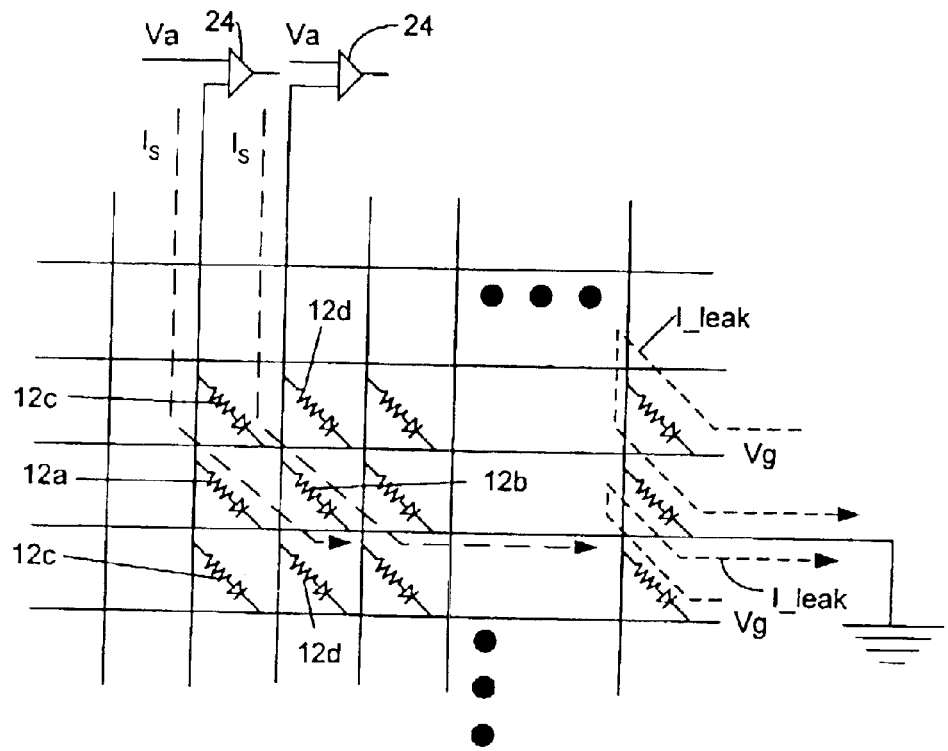
Figure 7C:
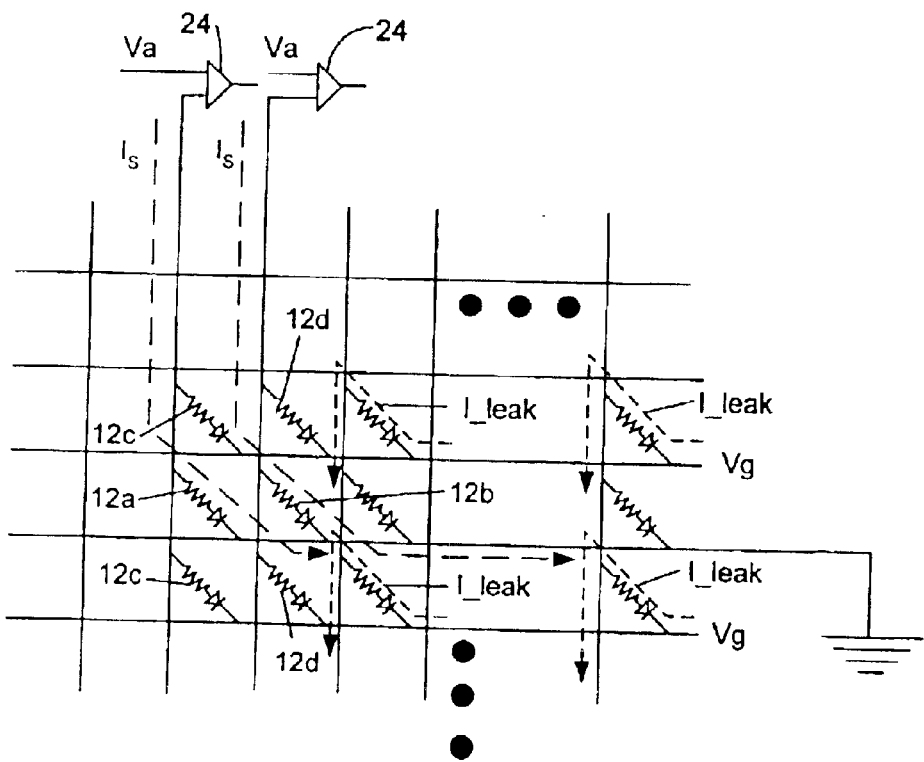

Reference is now made to FIG. 4, which shows a sense amplifier 24 and selected reference and data elements 12a and 12b, respectively. Each selected data element 12a and 12b is represented by a resistor R12a and R12b, respectively. Each memory cell element 12a and 12b further includes a unidirectional conducting gate or diode 13a and 13b, respectively. Diodes 13a and 13b are utilized to provide isolation between the memory cell elements during a read operation from sensing other data and reference elements 12a and 12b on adjacent word lines that share the same bit line. Significantly, the diodes 13a and 13b form a conductive path from the bit lines 16a and 16b to their respective word lines 14. Unfortunately, leakage currents can still occur during the read operation because of the reversed bias current that exists at each diode junction as well as because of the current path that exists between cells sharing common word lines or bit lines. Further, as the cell array size increases, the leakage current dominates the sense signal. Also, additional noise occurs during a sense operation due to the leakage current paths. To circumvent this problem, unselected word lines are connected to a potential Vg that is substantially equal to Va. The advantage of biasing the unselected word-lines is illustrated in FIGS. 7a–c. The leakage currents due to parallel paths in the array are diverted away from the sense currents so that the measurements of these currents are more accurate and reliable.

The sense amplifier 24 includes a differential amplifier 30 having a first input node $S_I$ and a second input node $R_I$. The differential sense amplifier 30 may be a differential sense input with cross-couple latch amplifier. Such a differential amplifier 30 may include FETs 30a, 30b, 30c, and 30d, which form a cross-couple latch amplifier. In one embodiment, transistors 30a and 30c are P-channel transistors. A read enable transistor 32 enables the FETs 30 during a READ operation, which in turn enables outputs OUTPUT and OUTPUT bar, which are complementary states, to balance. Transistors 34a and 34b are biased to clamp the nodes $S_I$ and $R_I$ close to a ground potential. Once transistor 32 turns off, the cross couple latch compares the current $I_S$ with $I_R$ enabling the OUTPUT and OUTPUT-bar to go to a corresponding state, which is illustrated in the READ timing diagram of the sense amplifier shown in FIG. 5.

Cell 12b serves as a reference bit and cell 12a is the data bit and both are located on the same row. A ground potential is applied to the selected row for both cell 12a and cell 12b. Preamplifier 36 has a first input Va with its output coupled to the gate input of transistor 36a in order to bias the bit or data column in which cell 12a is located. A second input Va enables preamplifier 38, which is coupled to gate input of transistor 38a, to bias the reference column to which cell 12b is located. The preamplifiers 36 and 38 regulate the voltages across the selected elements 12a and 12b. All other unselected rows are biased with a voltage Vg that is substantially equaled to Va so as to create an equipotential condition on all unselected memory cells on the same selected bit lines 16a and 16b within the array, thereby inhibiting leakage current or current sneak paths from developing across other cells within the same row or column as the reference cell 12b or data cell 12a. As a result, the unselected memory cells (12d, 13c) on the selected bit lines 16a and 16b have 0.0 Volt bias thus no current flows in these unselected memory cells. Other unselected memory cells are reversed bias thus allowing only their leakage current to flow, which is steered away from the sense current to the ground without interference with the sense current signal. Typically, the bias is set by a voltage source Vg, but may also be at ground potential or some other desired bias voltage that conforms to the circuit design configuration. For example, a design configuration as illustrated in FIG. 7a. A voltage source Va is applied to the selected word line. The selected bit lines are connected to the input of the sense amplifier, a voltage Vg is applied to the other input of sense amplifier thus bias the selected bit lines to Vg. All unselected world lines are bias also to Vg to steer the leakage current I_leak away from the sense currents $I_S$. The voltage source Vg is set at value desirable for the operation of the memory array. It could be very well at the ground potential or some other bias voltage.

Referring now to FIG. 7b, one input of sense amplifier 24 is connected to selected bit-line 16 and a voltage Va is applied to the other input of sense amplifier thus biasing the selected bit-lines to a potential Va. A ground potential is applied to the selected word-line 14 and all other unselected word-lines are connected to a voltage source Vg that is substantially equaled to Va. The unselected memory cells 12a and 12b have a potential Va across each of them that develops a current Is flowing through these bit cells and these current Is are sensed by the amplifier 24 to determine the resistance state of the selected bit cells.

Meanwhile, the unselected bit cells 12c and 12d are sharing the same bit-lines 16 as selected bit cells 12a and 12b, but they are connected to unselected word lines. The potential across these unselected bit cells 12c and 12d is Va−Vg~0 (zero) thus no current flows in these bit cells. The rest of the unselected bit cells have only the leakage currents I_leak flow through them to the ground on the selected word line and they do not interfere with the sense currents $I_S$.

FIG. 7c is an extension of the biasing method illustrated in FIG. 7b. In this configuration, the unselected bit-lines are connected to ground potential thus the leakage currents I_leak flow to ground through the unselected bit-lines. As such, only the sense currents $I_S$ flow in the selected word-line 14.

A current I_ref=(Va−Vd)/R12a flows in transistor 36a, where R12a is the resistive value of the memory cell 12a and Vd is the diode voltage of diode 13a, which is typically approximately 0.7 V. A transistor 36b, which is identical to transistor 36a, is a current mirror to 36a that carries a current $I_R$ to transport it the input of sense amplifier 30. Current $I_R$ is equal to I_ref. Similarly, a current I_data=(Va−Vd)/R12b flows in transistor 38a, where R12b is the resistive value of the memory cell 12b. A transistor 38b, which is identical to transistor 38a, is a current mirror to 38a that carries a current $I_S$ to be transported to the other input of sense amplifier 30. Current $I_S$ is equal to I_data.

Figure 5:
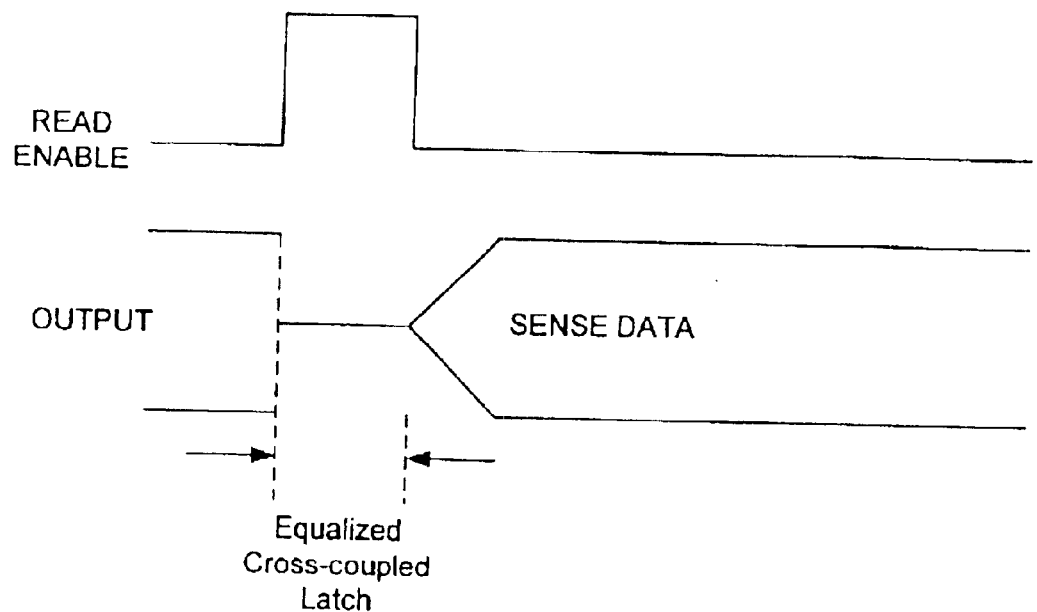
FIG. 5 illustrates a timing diagram of the sensing and output of a data cell and reference cell as performed on the sensing amplifier of FIG. 4.

Initially, transistor 32 is turned on when Read Enable is pulled high as shown in FIG. 5. This forces the OUTPUT and OUTPUT-bar to be similar to about the mid-point between Vdd and ground.

Once read enable switch 32 is switched off, the cross-couple latch senses the difference in magnitude of currents $I_S$ and $I_R$. When $I_S$ is less than $I_R$, the output is high, which means R12b is in a parallel state and R12a is in an anti-parallel state. When $I_S$ is greater than $I_R$, the output is low, which means R12b is in an anti-parallel state and R12a is in a parallel state.

The preamplifiers 36 and 38 are preferably calibrated to minimize differences in their offset voltages (ofst1, ofst2). The offset voltages (ofst1, ofst2) should be very close to being equal to each other and they should be near zero. The transistor pair 36a, b and 38a, b are preferably matched in properties and size so they are less likely to degrade the sense signals $I_S$ and $I_R$.

The sensing may be performed in current mode or voltage mode. In current mode, the preamplifiers 36 and 38 regulate the voltages at the sense and reference nodes S0 and R0 to be equal to the array voltage Va. The sense and reference currents ($I_S$ and $I_R$), which are created by the voltage drop across the selected elements 12a and 12b, flow to the input nodes $S_I$, $R_I$ of the differential current sense amplifier 30.

In voltage mode, the sense current ($I_S$) is converted to a voltage (e.g., by integrating the sense current over a period of time) or simply terminate $I_S$ and $I_R$ with a pair of resistors. When $I_S$ is less than $I_R$, the potential at node $S_I$ is lower than the potential at node $R_I$.

Once a reliable signal on the output of the differential amplifier 30 has developed, the output of the amplifier 30 is strobed into the data register 26. An on-chip controller 29 (see FIG. 2) may be provided to generate a signal STR for causing the output of the amplifier 30 to be strobed into the data register 26. The strobe signal STR could be as simple as a delayed pulse generated by the last address or write/read command.

The information storage device according to the present invention may be used in a wide variety of applications. For example, the information storage device may be used for long-term data storage in a computer. Such a device offers many advantages over conventional long-term data storage devices such as hard drives. Accessing data from MRAM cells is orders of magnitude faster than accessing data from hard drives. As such, MRAM cells can even replace SRAM or DRAM as the main system memory. In addition, the information storage device according to the present invention is more compact than hard drives.

The information storage device according to the present invention may be used in digital cameras for long-term storage of digital images or as embedded memories to improve the performance of a system on chip devices.

The present invention is not limited to the specific embodiments described and illustrated above. Instead, the present invention is construed according to the claims that follow.

It is to be understood that the above-referenced arrangements are only illustrative of the application for the principles of the present invention. Numerous modifications and alternative arrangements can be devised without departing from the spirit and scope of the present invention while the present invention has been shown in the drawings and fully described above with particularity and detail in connection with what is presently deemed to be the most practical and preferred embodiments(s) of the invention, it will be apparent to those of ordinary skill in the art that numerous modifications can be made without departing from the principles and concepts of the invention as set forth in the claims.

What is claimed is:

1. A process of making a data storage device, comprising:
    forming a plurality of word lines;
    forming a plurality of bit lines;
    forming a resistive crosspoint array of memory cells, each memory cell connected to a respective bit line and coupled to a respective word line;
    forming a unidirectional conductive path from the bit line to the word line through the memory cell;
    applying a sense signal to a selected one of the plurality of word lines; and
    applying a leakage current diverting signal to unselected ones of the plurality of the word lines, wherein the leakage current diverting signal applying step comprises forming an equipotential generator coupled to the word lines and the bit lines and operable to set voltage levels in the resistive crosspoint memory cell array to substantially prevent parasitic currents from interfering with the sense signal.

2. The process of claim 1, wherein the step of applying the leakage current comprises diverting leakage currents away from the sense signal.

3. The process of claim 1, further comprising connecting together a group of the unselected word lines to set an average voltage that is approximately equal to a voltage applied to the resistive crosspoint array.

4. The process of claim 1, further comprising operating the equipotential generator to establish equipotential isolation of a selected bit line based upon feedback from one or more of the unselected word lines.

5. The process of claim 1, wherein the step of forming a unidirectional conductive path is carried out with an isolation diode, further comprising coupling an input node of the isolation diode to a voltage follower transistor and coupling the equipotential generator to gates of the voltage follower transistor.

* * * * *